United States Patent
Feng (10) Patent No.: US 10,892,305 B2
(45) Date of Patent: Jan. 12, 2021

(54) TOUCH STRUCTURE, ORGANIC LIGHT EMITTING DIODE (OLED) DISPLAY TOUCH PANEL AND TOUCH DISPLAY DEVICE

(71) Applicant: Wuhan China Star Optoelectronics Semiconductor Display Technology Co., Ltd., Hubei (CN)

(72) Inventor: Xiaoliang Feng, Guangdong (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 267 days.

(21) Appl. No.: 16/084,439

(22) PCT Filed: May 11, 2018

(86) PCT No.: PCT/CN2018/086475
§ 371 (c)(1),
(2) Date: Sep. 12, 2018

(87) PCT Pub. No.: WO2019/184058
PCT Pub. Date: Oct. 3, 2019

(65) Prior Publication Data
US 2020/0303467 A1      Sep. 24, 2020

(30) Foreign Application Priority Data

Mar. 29, 2018   (CN) .......................... 2018 1 0271615

(51) Int. Cl.
*H01L 27/32* (2006.01)
*G06F 3/044* (2006.01)
(Continued)

(52) U.S. Cl.
CPC ............ *H01L 27/323* (2013.01); *G06F 3/047* (2013.01); *G06F 3/0412* (2013.01);
(Continued)

(58) Field of Classification Search
None
See application file for complete search history.

(56) References Cited

U.S. PATENT DOCUMENTS

2011/0291966 A1    12/2011   Takao
2014/0118292 A1    5/2014    Kim
(Continued)

FOREIGN PATENT DOCUMENTS

CN    103218077 A    7/2013
CN    103278955 A    9/2013
(Continued)

OTHER PUBLICATIONS

International search report dated Jan. 4, 2019 from corresponding application No. PCT/CN2018/086475.
(Continued)

*Primary Examiner* — Ifedayo B Iluyomade
(74) *Attorney, Agent, or Firm* — Leong C. Lei (57) ABSTRACT

The present disclosure relates to a touch structure for OLED structure. The touch structure includes an electrode layer, an insulation layer, and a bridge layer stacked in sequence. The electrode layer is of a metal mesh structure having a plurality of driving electrodes along a first direction and a plurality of sensing electrodes along a second direction. The driving electrodes and the sensing electrodes are disposed within gaps of an emission layer of the OLED. The first direction and the second direction forming a first angle. Two adjacent driving electrodes along the first direction are connected. The bridge layer are configured with bridge wires. The insulation layer is configured with openings. The bridge wires connect to two adjacent sensing electrodes along the second direction via the openings.

10 Claims, 5 Drawing Sheets

(51) Int. Cl.
*G06F 3/041* (2006.01)
*G06F 3/047* (2006.01)

(52) U.S. Cl.
CPC ........ *G06F 3/0446* (2019.05); *H01L 27/3276* (2013.01); *G06F 2203/04111* (2013.01); *G06F 2203/04112* (2013.01)

(56) References Cited

U.S. PATENT DOCUMENTS

2018/0095584 A1\* 4/2018 Lee ................... H01L 27/3213
2018/0358413 A1\* 12/2018 Lee ..................... G06F 3/0443

FOREIGN PATENT DOCUMENTS

| | | |
|---|---|---|
| CN | 103329642 A | 9/2013 |
| CN | 103576968 A | 2/2014 |
| CN | 103649884 A | 3/2014 |
| CN | 104576704 A | 4/2015 |
| CN | 106547405 A | 3/2017 |
| CN | 106873839 A | 6/2017 |
| CN | 107357475 A | 10/2017 |
| CN | 107450772 A | 12/2017 |

OTHER PUBLICATIONS

Office Action dated Aug. 2, 2019 from corresponding application No. CN 201810271615.6.

\* cited by examiner

TOUCH STRUCTURE, ORGANIC LIGHT EMITTING DIODE (OLED) DISPLAY TOUCH PANEL AND TOUCH DISPLAY DEVICE

CROSS REFERENCE TO RELATED APPLICATIONS

The present application is a National Phase of International Application Number PCT/CN2018/086475, filed May 11, 2018, and claims the priority of China Application No. 201810271615.6, entitled "TOUCH STRUCTURE, ORGANIC LIGHT EMITTING DIODE (OLED) DISPLAY TOUCH PANEL AND TOUCH DISPLAY DEVICE", filed on Mar. 29, 2018, the disclosure of which is incorporated herein by reference in its entirety.

BACKGROUND

1. Technical Field

The present disclosure relates to organic light emitting (OLED) technology field, and more particularly to a touch structure, an OLED display touch panel and touch display device.

2. Description of Related Art

With the development of technology, display technology is more and more diversified. OLED shows its superior performance more and more, such as, the brightness is higher, color gamut is wider, pixels are smaller, and display effect is better. Touch technology, as a display assisting technology, especially a capacitive screen, also plays a very important role. The manufacturing technology of the touch includes: Out Cell, On Cell, and In Cell according to the structure. Out Cell includes several technical solutions, such as FF (Film to Film), GF (Glass to Film), GG (Glass to Glass), and OGS (One Glass Solution) With the advancement of technology, the combination of touch control and display has become more and more compact. The major display panel manufacturers have successively developed and promoted On Cell and In Cell technologies, which have become mainstream. On-cell and In-cell technology are various. Many of those solutions adopt transparent electrodes as conductive materials. In consideration of touch performance, transmittance and noise processing must be taken into consideration. This leads to the condition that less material may be adopted (only ITO or transparent nano-silver can be used). Among them, In-cell technology enables display devices to be thinner than On-cell, and thus becomes the focus of technology research and development.

Metal mesh is a new type of touch structure technology. It is mostly used on On-cell technology, and it may block the display screen, and has visibility at certain angles, which affects the display quality.

SUMMARY

The present disclosure includes the following technical solutions.

In a first aspect, a touch structure for organic light emitting diode (OLED) includes: an electrode layer, an insulation layer, and a bridge layer stacked in sequence, the electrode layer being of a metal mesh structure having a plurality of driving electrodes along a first direction and a plurality of sensing electrodes along a second direction, the driving electrodes and the sensing electrodes being disposed within gaps of an emission layer of the OLED, the first direction and the second direction forming a first angle, two adjacent driving electrodes along the first direction being connected, the bridge layer being configured with bridge wires, the insulation layer being configured with openings, the bridge wires connecting to two adjacent sensing electrodes along the second direction via the openings.

In one instance, the driving electrodes and the sensing electrodes comprises a plurality of first metal lines extending in the third direction and a plurality of second metal lines extending in the fourth direction, the third direction and the fourth direction are at a second angle β, the bridge lines comprises at least one third metal line extending along the third direction, and at least one fourth metal line extending along the fourth direction, the plurality of the first metal lines are spaced apart from each other by a first interval, and the plurality of the second metal lines are spaced apart from each other by a second interval.

In one instance, the first metal line and the second metal line between any adjacent driving electrodes and the sensing electrodes are disconnected.

In one instance, the driving electrodes are connected by the first metal lines and the second metal lines extending from two opposite corners of the driving electrodes, and the sensing electrodes are insulated from each other by the first metal lines and the second metal lines extending from two opposite corners of the sensing electrodes so as to avoid the first metal lines and the second metal lines extending from the two opposite angles of the driving electrode.

In one instance, the bridge lines comprises two third metal lines and two fourth metal lines, and the third metal lines and the fourth metal lines cooperatively define a parallelogram structure, a distance between the two third metal lines is not less than three times the first interval, and the distance between the two second metal lines is not less than three times the second interval.

In one instance, each of the sensing electrodes corresponds to at least one openings, and the bridge wires connect to the sensing electrode through at least one openings.

In a second aspect, an organic light emitting diode (OLED) display touch panel includes: the TFT layer, the emission layer, and any one of the above touch structure, the emission layer being disposed on the TFT layer, the electrode layer of the touch structure being disposed on the TFT layer and being arranged within gaps of the emission layer.

In one instance, the TFT layer comprises an anode, the electrode layer comprises at least one driving electrode and at least one sensing electrode, the driving electrodes and the sensing electrodes are disposed on the same layer with the anode, the insulation layer of the touch structure covers the driving electrodes and the sensing electrodes, and the insulation layer extends to the anode to insulate the driving electrodes and the sensing electrodes from the anode.

In one instance, the panel further comprises a cathode, the emission layer, the anode, and the cathode constitute a sub-pixel, the first metal lines and the second metal lines of the driving electrodes and the sensing electrodes are arranged in the gaps of the sub-pixels.

In a third aspect, a touch display device, includes: any one of the above touch structure for OLED, the touch structure having an electrode layer, an insulation layer, and a bridge layer stacked in sequence, the electrode layer being of a metal mesh structure having a plurality of driving electrodes along a first direction and a plurality of sensing electrodes along a second direction, the driving electrodes and the sensing electrodes being disposed within gaps of an emission layer of the OLED, the first direction and the second direction forming a first angle, two adjacent driving electrodes along the first direction being connected, the bridge layer being configured with bridge wires, the insulation layer being configured with openings, the bridge wires connecting to two adjacent sensing electrodes along the second direction via the openings.

In view of the above, the electrode layer is of a metal mesh structure. The driving electrodes and the sensing electrodes are arranged within the gaps of the emission layer of the OLED. The insulation layer is configured with openings. The bridge wirings connect two adjacent sensing electrode along the second direction via the openings. The driving electrodes on the same layer are connected, and the sensing electrodes are connected by the bridge wirings so as to realize the touch function of the metal mesh structure without blocking the display panel.

BRIEF DESCRIPTION OF THE DRAWINGS

In order to more clearly illustrate the embodiments of the present disclosure or prior art solutions, the drawings used in the description of the embodiments or prior art will be briefly described below. The drawings are merely some embodiments of the present disclosure, and those skilled in the art can also obtain other drawings based on these drawings without any creative work.

DETAILED DESCRIPTION

Following embodiments of the invention will now be described in detail hereinafter with reference to the accompanying drawings.

The touch structure provided by this disclosure can be used in touch display devices, such as smart phones, tablet computers, mobile assistants, electronic game machines, and the like.

Figure 1:
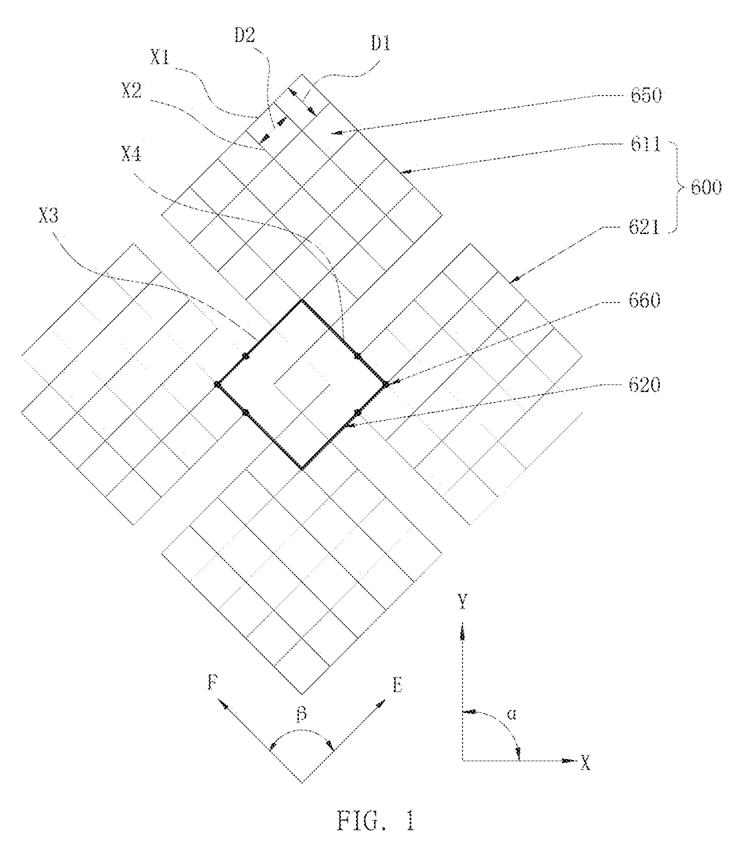
FIG. 1 is a schematic view showing one touch unit of the touch structure in accordance with one embodiment of the present disclosure.
Figure 2:
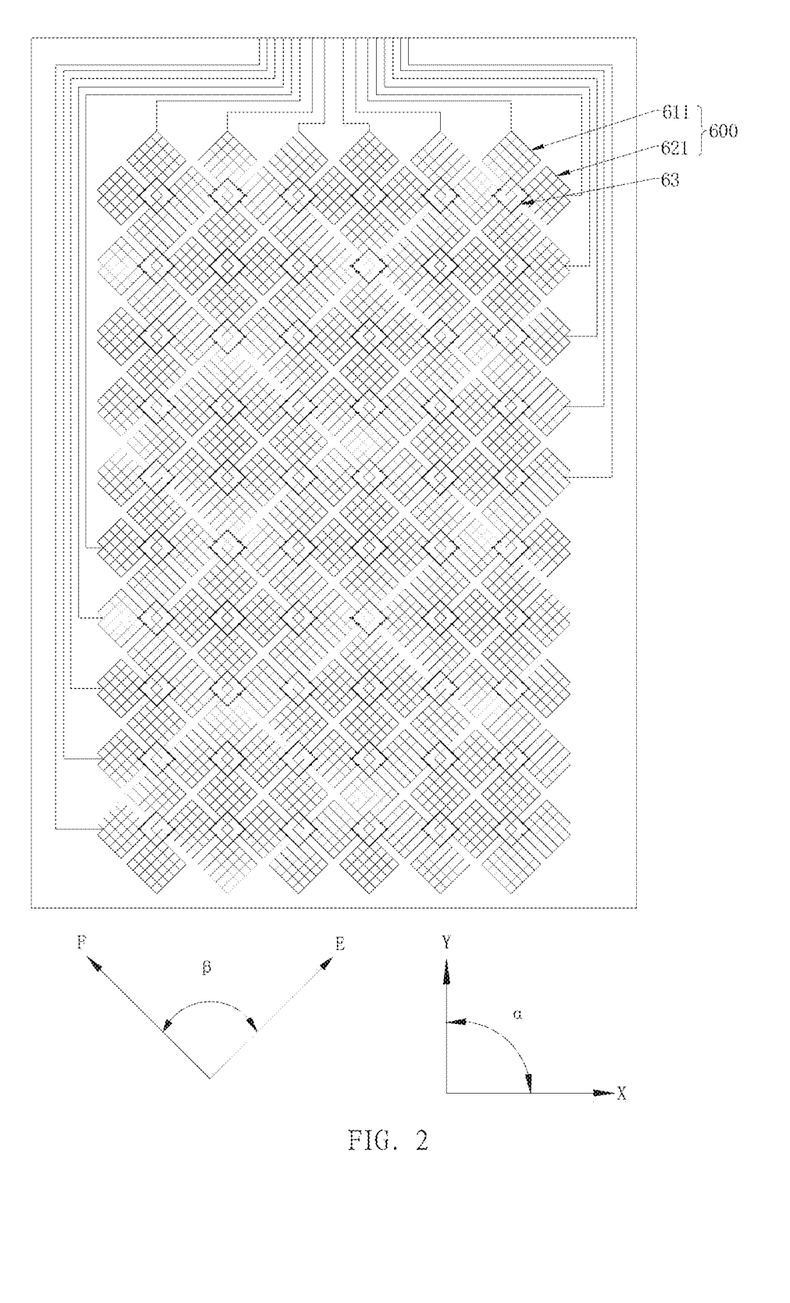
FIG. 2 is a schematic view of the overall touch structure in accordance with one embodiment of the present disclosure.

FIG. 1 is a schematic view showing one touch unit of the touch structure in accordance with one embodiment of the present disclosure. FIG. 2 is a schematic view of the overall touch structure in accordance with one embodiment of the present disclosure. The touch structure for OLEDs includes an electrode layer 600, an insulation layer (as indicated by the reference numeral 610 in FIG. 4), and a bridge layer 63. The electrode layer 600 is of a metal mesh structure, including a plurality of driving electrodes 611 along a first direction Y. and a plurality of sensing electrodes 621 along a second direction Y. The driving electrodes 611 and the sensing electrodes 621 are disposed within gaps of the emission layer, as indicated by reference numeral 200 in FIG. 5) of the OLED. The first direction Y and the second direction X form a first angle (a). Two adjacent driving electrodes 611 along the first direction Y are connected. The bridge layer 63 is configured with bridge wires 620. The insulation layer 610 is configured with openings 660 (referring to FIG. 5). The bridge wires 620 connects to two adjacent sensing electrodes 621 along the second direction X via the openings 660.

The electrode layer 600 is of the metal mesh structure. The driving electrodes 611 and the sensing electrodes 621 are disposed in the gaps of the emission layer 200 of the OLED. The insulation layer 610 is configured with the openings 660. The bridge wires 620 connects to the two adjacent sensing electrodes 621 along the second direction X via the openings 660. The driving electrodes 611 on the same layer are connected. The sensing electrodes 621 are connected by the bridge wires 620 to realize the touch function of the metal mesh structure with respect to the In-cell solution. As such, the display panel may not be blocked, and the display performance may be enhanced.

Referring to FIG. 1, the electrode layer 600 of the touch structure of one touch unit includes two driving electrodes 611 and two sensing electrodes 621. The driving electrodes 611 and the sensing electrodes 621 are configured with spaces for receiving a plurality of sub-pixels. As such, the touch unit may correspond to a plurality of sub-pixels.

The driving electrodes 611 and the sensing electrodes 621 of the electrode layer 600 are configured on the same layer such that a thickness of the touch structure may be decreased, which contributes to a decreased thickness of the display device. In one embodiment, the driving electrodes 611 and the sensing electrodes 621 may be manufactured by: The metal film is first plated, and then the driving electrodes 611 and the sensing electrodes 621 are formed on the metal film by processes such as exposure, etching, and peeling. The driving electrodes 611 and the sensing electrodes 621 may be made by metal, preferably silver or copper.

The insulation layer 610 is configured to separate the driving electrodes 611 from the sensing electrodes 621. In addition, the openings 660 are configured at the locations needed to be connected with the sensing electrodes 621 such that the bridge wires 620 connect to the sensing electrodes 621. In this way, the sensing electrodes 621 connected with the bridge wires 620 are insulated from the driving electrodes 611, which avoids the short-connection. The insulation layer 610 may further compress the first photoresist regions 61 and the second photoresist regions 62 to prevent the driving electrodes 611 and the sensing electrodes 621 from being tilted up. The insulation layer 610 may be made by transparent materials. In one embodiment, the insulation layer 610 is made by SiNx (silicon nitride) material, wherein a SiNx film layer is manufactured by a PECVD (Plasma Enhanced Chemical Vapor Deposition) method. Afterward, the SiNx film layer is exposed, etched, and stripped to form an insulation layer pattern. In other embodiments, the insulating layer 610 may also be made of organic film material, and the organic film is covered on the driving electrodes 611 and the sensing electrodes 621 by an exposure and development insulating layer.

The bridge wires 620 may be formed directly on the insulation layer 610. In one embodiment, the bridge wires 620 may be made by the same method with the driving electrodes 611 and the sensing electrodes 621. Alternatively, the bridge wires 620 may be formed on a film. The bridge wires 620 may be made by the same material with the driving electrodes 611 and the sensing electrodes 621.

The angle α between the first direction Y and the second direction X may be 90°, that is, the extending directions of the plurality of driving electrodes 611 and the plurality of sensing electrodes 621 are vertical, so as to facilitate the binding when being arranged on the touch panel. In other embodiments, the angle α may be other angles such that the driving electrode 611 cross with the sensing electrode 621, and a coupling capacitor may be formed between the driving electrodes 611 and the sensing electrodes 621.

In one embodiment, the two adjacent driving electrodes 611 along the second direction X are connected, and the bridge wires 620 may connect two adjacent driving electrodes 611 along the first direction Y. That is, the driving electrodes 611 are connected by the bridge wires 620, and the sensing electrodes 621 are directed connected to realize the touch function.

In one embodiment, the driving electrodes 611 and the sensing electrodes 621 include a plurality of first metal lines X1 extending in the third direction E and a plurality of second metal lines X2 extending in the fourth direction F. The third direction E and the fourth direction F are at a second angle β. The bridge line 620 includes at least one third metal line X3 extending along the third direction E, and at least one fourth metal line X4 extending along the fourth direction F. A plurality of the first metal lines X1 are spaced apart from each other by a first interval D1, and a plurality of the second metal lines X2 are spaced apart from each other by a second interval D2.

A plurality of first metal lines X1 and second metal lines X2 are connected to form a mesh structure, and two adjacent first metal lines X1 and two adjacent second metal lines X2 cooperatively define a hollow area 650. The hollow area 650 is a parallelogram, and the hollow region 650 is configured to accommodate the sub-pixels of the display device, so that the first metal line X1 and the second metal line X2 can be disposed in the gaps of the sub-pixels, while the metal lines are disposed on the sub-pixels in the conventional solutions. The proposed touch structure reduces the thickness of the display device, and because the first metal line X1 and the second metal line X2 are hidden in the sub-pixel gap, the pixel space is not occupied. The touch structure is prevented from being visualized. In addition, the first metal line X1 and the second metal line X2 are hidden in the gaps of the sub-pixels, so that the widths of the first metal line X1 and the second metal line X2 can be controlled more loosely, and the difficulty of the manufacturing process can be reduced.

In one embodiment, the second angle J between the third direction E and the fourth direction F is 90°, so that the third direction E is perpendicular to the fourth direction F, so that the hollow region 650 is rectangular. Due to the structure of the sub-pixels is rectangular, the touch structure of the present embodiment can be better adapted to the display device. Further, the first angle α between the first direction Y and the second direction X of the driving electrodes 611 and the sensing electrodes 621 is 90°, and the angle between the first direction Y and the third direction E and the fourth direction F is both 45°. Au such, the structure of the driving electrodes 611 and the sensing electrodes 621 is regular, and the regular sub-pixel structure can be better adapted.

Further, the distance between the adjacent driving electrodes 611 and the sensing electrodes 621 in the third direction E is defined as a second interval D2, and the distance between the adjacent driving electrodes 611 and the sensing electrodes 621 adjacent in the fourth direction F is defined as a first interval D. In one embodiment, the first interval D1 and the second interval D2 are equal, so that the hollow region 650 is square and can be adapted to the sub-pixels of the rectangular structure, and the overall composition of the driving electrodes 611 and the sensing electrodes 621 is a square with a 450 deflection in the first direction, which better fits the sub-pixels of the display device.

The third metal line X3 extends in the third direction E. and the fourth metal line X4 extends in the fourth direction F, so that the bridge wires 620 is also located in the gap of the sub-pixels. In this way, the structure of the bridge wires 620 is similar to the structure of the driving electrodes 611 and the sensing electrodes 621, which facilitates the manufacturing process. In addition, the touch effect and the display performance are good.

In one embodiment, the first metal line X1 and the second metal line X2 between any adjacent driving electrodes 611 and the sensing electrodes 621 are disconnected. In order to prevent the short circuit, the driving electrode 611 and the sensing electrode 621 cannot be directly connected. It is necessary to maintain a certain distance between the driving electrode 611 and the sensing electrode 621. The distance is preferably the first interval D1 or the second interval D2.

In one embodiment, the adjacent driving electrodes 611 along the first direction Y are connected by the first metal line X1 and the second metal line X2 extending from two opposite corners, and the first metal line X1 and the second metal line X2 extending from the two opposite corners of the two adjacent sensing electrodes 621 along the second direction X are insulated, so as to avoid the first metal line X1 and the second metal line X2 extending from the two opposite corners of the driving electrodes 611. In this way, the wirings of the touch structure are configured along the third direction E or the fourth direction F. Thus, the wirings are arranged in the gaps of the sub-pixels, which contributes to the manufacturing process. The structure is regular, and the display performance may be enhanced.

In an embodiment, the bridge line 620 includes two third metal lines X3 and two fourth metal lines X4, and the third metal line X3 and the fourth metal line X4 cooperatively define a parallelogram structure. The distance between the two third metal lines X3 is not less than 3 times the first interval D1, and the distance between the two second metal lines X4 is not less than 3 times the second interval D2. In one embodiment, the second angle β between the third direction E and the fourth direction F is 90° so that the third direction E is perpendicular to the fourth direction F, and the third metal line X3 and the fourth metal line X4 are also perpendicular to each other. The two third metal wires X3 and the two fourth metal wires X4 cooperatively defines a rectangle. Further, the distance between the two third metal wires X3 is equal to three times the first interval D1. The distance between the fourth metal lines X4 is equal to three times the second interval D2. Further, the first interval D1 and the second interval D2 are equal. The two third metal lines X3 and the two fourth metal lines X4 cooperatively defines a square. The distance between two of the third metal lines X3 may be greater than three times the first interval D1, and the distance between two of the fourth metal lines X4 may be greater than three times the second interval D2. For example, the distance between two of the third metal lines X3 is equal to four times the first interval D1, and the distance between two of the fourth metal lines X4 is equal to five times the second interval D2. As long as the third metal line X3 is extended in the third direction E, the fourth metal line X4 extends in the fourth direction F and is located within the gap between adjacent sub-pixels.

Further, each of the sensing electrodes 611 corresponds to at least one openings 660, and the bridge wires 620 connect to the sensing electrode 611 through at least one openings 660. By setting at least one opening, the bridge wires 620 can be connected to the sensing electrode 621, wherein the openings 660 can be two or more than two. In an example, the bridge wires 620 of one of the through holes can be prevented from being broken due to poor contact, which contributes to the yield rate.

Figure 3:
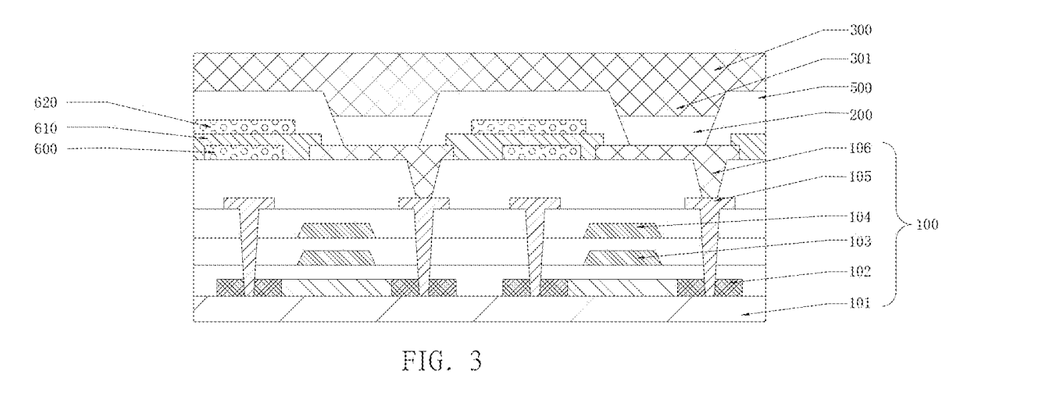
FIG. 3 is a schematic view showing the stacked structure of the OLED display touch panel in accordance with one embodiment of the present disclosure.
Figure 4:
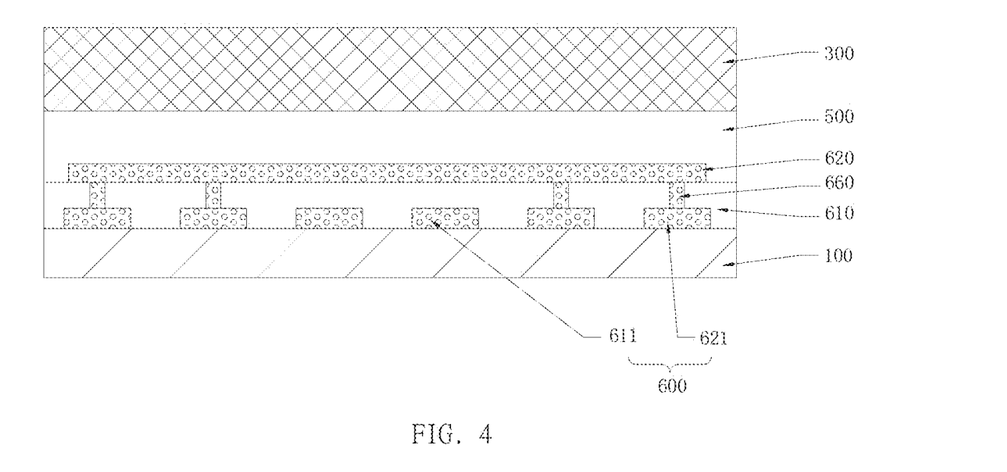
FIG. 4 is another schematic view showing the stacked structure of the OLED display touch panel in a different angle, wherein the structure of the TFT layer is omitted.
Figure 5:
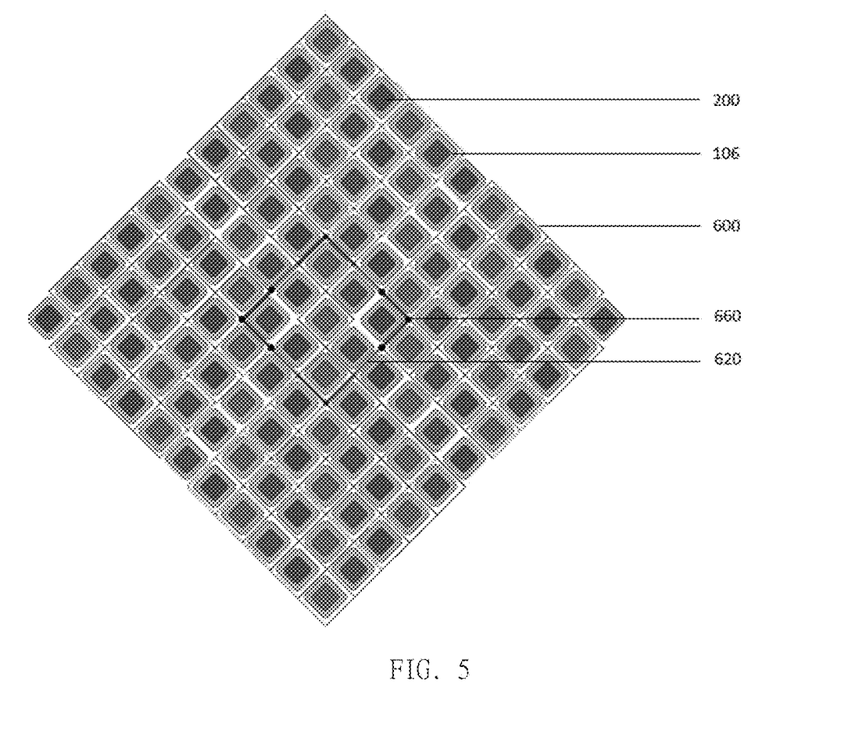
FIG. 5 is a schematic view of the touch structure of the touch unit matching with the OLED in accordance with one embodiment of the present disclosure.

FIG. 3 is a schematic view showing the stacked structure of the OLED display touch panel in accordance with one embodiment of the present disclosure. FIG. 4 is another schematic view showing the stacked structure of the OLED display touch panel in a different angle, wherein the structure of the TFT layer is omitted. FIG. 5 is a schematic view of the touch structure of the touch unit matching with the OLED in accordance with one embodiment of the present disclosure. In one embodiment, an OLED display touch panel includes a TFT layer 100, an emission layer 200, and a touch structure. The emission layer 200 is arranged on the TFT layer 100. The electrode layer 600 is arranged on the TFT layer 100 and is the gap of the emission layer 200.

The touch structure is disposed on the TFT layer 100 and disposed in the gap of the emission layer 200 to form an in-cell touch structure, so that the thickness of the OLED touch panel in this embodiment is reduced, and the emission layer is formed without the touch structure. Thus, the light of the emission layer is not blocked, and the light emitting effect of the emission layer is not affected.

The touch structure in this embodiment may be used on a flexible OLED panel, or may be used in a hard-screen OLED panel. That is, it may be used in a color light emitting OLED structure, and may also be used in a white light OLED structure.

Further, the TFT layer 100 includes an anode 106. The electrode layer 600 includes at least one driving electrode 611 and at least one sensing electrode 621. The driving electrode 611 and the sensing electrode 621 are disposed on the same layer with the anode 106. The insulation layer 610 of the touch structure 600 covers the driving electrodes 611 and the sensing electrodes 621 and extends to the anode 106 to insulate the driving electrodes 611 and the sensing electrodes 621 from the anode 106.

The TFT layer further includes a stacked substrate 101, an active layer 102, a gate layer 103/104, a source-drain layer 105, and an insulation protection layer (not shown) between the layers. The anode 106 is disposed on the insulation protection layer on the source-side drain layer 105. The emission layer 200 is disposed on the anode 106. The anode 106 may be indium tin oxide (ITO), so that the TFT layer 100 controls the current of the emission layer 200. The size of the switch is used to change the emission brightness of the emission layer 200 for display or illumination purposes.

Before the emission layer 200 is fabricated, a flat layer (PLN) layer 500 is formed, and the emission layer 200 is configured at the location corresponding to the anode 106. The flat layer 500 may be used to protect the emission layer 200 and to form a flat structure. In one embodiment, the insulation layer 610 may also be replaced with the flat layer. A water resistant layer 300 and a cathode 301 are disposed on the flat layer 500. The position of the cathode 301 corresponds to the position of the emission layer 200. Since the emission layer 200 is sensitive to water and oxygen, the water resistant layer 300 is used to isolate water and oxygen, such that the emission layer. 200 is prevented from being damaged by water and oxygen.

The emission layer 200, the anode 106, and the cathode 301 constitute a sub-pixel (as denoted by reference numerals 106 and 200 in FIG. 5, the cathode 301 is omitted in the figure). The first metal line X1 and the second metal line X2 of the driving electrode 611 and the sensing electrode 621 are disposed in the gap between the sub-pixels.

The sub-pixel is a basic display unit of the OLED display touch panel, and the sub-pixel may be an R (red) pixel, a G (green) pixel, or a B (blue) pixel. Each sub-pixel may emit light of one color. The sub-pixels are combined to form a color display pattern. The sub-pixels may also be pixels that emit only white light, so that the touch panel emits white light and can be used for illumination.

The first metal line X1 and the second metal line X2 are disposed in the gaps of the sub-pixels. Further, the bridge wires 620 of the touch structure are also disposed in the gaps of the sub-pixels so that the traces of the touch control structure are all located along the gaps. The gap arrangement of the sub-pixels, relative to the scheme in which the traces of the existing touch structure are located on the sub-pixels, does not block the light emission of the sub-pixels. The requirement as to the materials and the line-width of the first metal line X1 and the second metal line X2 can be reduced. For example, if the layout of the outlet structure is arranged on the sub-pixel, the material of the metal line can be selected with only a small amount of space, such as ITO or transparent nano-silver. The material is scarce and expensive, and the demand toward the resolution of the device is getting higher and higher. It is necessary to fabricate a line width of about 5 nm to be unable to see the touch line during display, and the process is difficult.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A touch structure for organic light emitting diode (OLED), comprising:

an electrode layer, an insulation layer, and a bridge layer stacked in sequence, the electrode layer being of a metal mesh structure comprising a plurality of driving electrodes along a first direction and a plurality of sensing electrodes along a second direction, the driving electrodes and the sensing electrodes being disposed within gaps of an emission layer of the OLED, the first direction and the second direction forming a first angle, two adjacent driving electrodes along the first direction being connected, the bridge layer being configured with bridge wires, the insulation layer being configured with openings, the bridge wires connecting to two adjacent sensing electrodes along the second direction via the openings;

wherein the driving electrodes and the sensing electrodes comprises a plurality of first metal lines extending in the third direction and a plurality of second metal lines extending in the fourth direction, the third direction and the fourth direction are at a second angle β, the bridge lines comprises at least one third metal line extending along the third direction, and at least one fourth metal line extending along the fourth direction, the plurality of the first metal lines are spaced apart from each other by a first interval, and the plurality of the second metal lines are spaced apart from each other by a second interval.

2. The touch structure as claimed in claim 1, wherein the first metal line and the second metal line between any adjacent driving electrodes and the sensing electrodes are disconnected.

3. The touch structure as claimed in claim 1, wherein the driving electrodes are connected by the first metal line and the second metal line extending from two opposite corners of the driving electrodes, and the first metal line and the second metal line extending from the two opposite corners of the adjacent sensing electrodes along the second direction are insulated so as to avoid the first metal line and the second metal line extending from the two opposite corners of the driving electrode.

4. The touch structure as claimed in claim 1, wherein the bridge lines comprises two third metal lines and two fourth metal lines, and the third metal lines and the fourth metal lines cooperatively define a parallelogram structure, a distance between the two third metal lines is not less than three times the first interval, and the distance between the two second metal lines is not less than three times the second interval.

5. The touch structure as claimed in claim 4, wherein each of the sensing electrodes corresponds to at least one of the openings, and the bridge wires connect to the sensing electrode through at least one of the openings.

6. A touch display device, comprising:
a touch structure for OLED, the touch structure comprising an electrode layer, an insulation layer, and a bridge layer stacked in sequence, the electrode layer being of a metal mesh structure comprising a plurality of driving electrodes along a first direction and a plurality of sensing electrodes along a second direction, the driving electrodes and the sensing electrodes being disposed within gaps of an emission layer of the OLED, the first direction and the second direction forming a first angle, two adjacent driving electrodes along the first direction being connected, the bridge layer being configured with bridge wires, the insulation layer being configured with openings, the bridge wires connecting to two adjacent sensing electrodes along the second direction via the openings; wherein the driving electrodes and the sensing electrodes comprises a plurality of first metal lines extending in the third direction and a plurality of second metal lines extending in the fourth direction, the third direction and the fourth direction are at a second angle β, the bridge lines comprises at least one third metal line extending along the third direction, and at least one fourth metal line extending along the fourth direction, the plurality of the first metal lines are spaced apart from each other by a first interval, and the plurality of the second metal lines are spaced apart from each other by a second interval.

7. The touch display device as claimed in claim 6, wherein the first metal line and the second metal line between any adjacent driving electrodes and the sensing electrodes are disconnected.

8. The touch display device as claimed in claim 6, wherein the driving electrodes are connected by the first metal line and the second metal line extending from two opposite corners of the driving electrodes, and the first metal line and the second metal line extending from the two opposite corners of the adjacent sensing electrodes along the second direction are insulated so as to avoid the first metal line and the second metal line extending from the two opposite corners of the driving electrode.

9. The touch display device as claimed in claim 6, wherein the bridge lines comprises two third metal lines and two fourth metal lines, and the third metal lines and the fourth metal lines cooperatively define a parallelogram structure, a distance between the two third metal lines is not less than three times the first interval, and the distance between the two second metal lines is not less than three times the second interval.

10. The touch display device as claimed in claim 9, wherein each of the sensing electrodes corresponds to at least one of the openings, and the bridge wires connect to the sensing electrode through at least one of the openings.

* * * * *